US012562695B2

(12) United States Patent
Yerramilli et al.

(10) Patent No.: US 12,562,695 B2
(45) Date of Patent: Feb. 24, 2026

(54) WIDEBAND LNA WITH OUTPUT MATCH CONFIGURABILITY

(71) Applicant: Murata Manufacturing Co., Ltd., Nagaokakyo (JP)

(72) Inventors: Phanindra Yerramilli, San Diego, CA (US); Emre Ayranci, Costa Mesa, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 447 days.

(21) Appl. No.: 18/335,549

(22) Filed: Jun. 15, 2023

(65) Prior Publication Data

US 2024/0421779 A1     Dec. 19, 2024

(51) Int. Cl.
*H03F 3/19* (2006.01)
(52) U.S. Cl.
CPC ......... *H03F 3/19* (2013.01); *H03F 2200/294* (2013.01); *H03F 2200/451* (2013.01)
(58) Field of Classification Search
CPC . H03F 3/19; H03F 2200/294; H03F 2200/451
USPC ........................................ 330/291
See application file for complete search history.

(56) References Cited

U.S. PATENT DOCUMENTS

| | | | |
|---|---|---|---|
| 12,170,536 B2 * | 12/2024 | Tripurari Jayaraman | .................. H03G 3/3052 |
| 2011/0018635 A1 | 1/2011 | Tasic et al. | |
| 2020/0091876 A1 | 3/2020 | Klaren | |
| 2021/0409055 A1 | 12/2021 | Ayranci et al. | |
| 2023/0148375 A1 | 5/2023 | Daruwalla et al. | |

OTHER PUBLICATIONS

International Search Report and Written Opinion issued for International PCT Application No. PCT/JP2024/019138 filed on May 24, 2024 on behalf of Murata Manufacturing Co., LTD. Mail Date: Aug. 7, 2024. 15 pages.

* cited by examiner

*Primary Examiner* — Hafizur Rahman
(74) *Attorney, Agent, or Firm* — Steinfl + Bruno LLP

(57) ABSTRACT

Methods and devices to mitigate the detrimental effects of highly capacitive output routes of multiple gain low noise amplifiers on the overall performance of the circuit are disclosed. The disclosed methods and devices implement the same inductive element across the output load in both the low gain and high gain operational modes. Furthermore, such devices implement switches to control the selection of different signal paths for the high gain and low gain mode. The implemented switches are also used to selectively adjust the isolation of the output stage of the LNA.

20 Claims, 9 Drawing Sheets

| gain mode | switch | switch State |
|-----------|--------|--------------|
| low gain  | S1     | closed       |
| low gain  | S2     | open         |
| low gain  | S3     | open         |
| high gain | S1     | open         |
| high gain | S2     | closed       |
| high gain | S3     | closed       |

| gain mode | switch | switch State |
|---|---|---|
| low gain | S1 | closed |
| low gain | S2 | open |
| low gain | S3 | closed |
| low gain | S4 | open |
| high gain | S1 | open |
| high gain | S2 | closed |
| high gain | S3 | closed |
| high gain | S4 | closed |

| gain mode | switch | switch State |
|-----------|--------|--------------|
| low gain  | S1     | closed       |
| low gain  | S2     | open         |
| low gain  | S3     | closed       |
| high gain | S1     | open         |
| high gain | S2     | closed       |
| high gain | S3     | closed       |

| gain mode | switch | switch State |
|---|---|---|
| low gain | S1 | closed |
| low gain | S2 | open |
| high gain | S1 | open |
| high gain | S2 | closed |

WIDEBAND LNA WITH OUTPUT MATCH CONFIGURABILITY

TECHNICAL FIELD

The present disclosure is related to low noise amplifiers (LNAs), and more particularly to methods and apparatus for designing wideband LNAs with output match configurability.

BACKGROUND

Throughout the present disclosure, the term "source follower" will be used to describe one of the basic single-stage field effect transistor (FET) amplifier topologies, typically used as a voltage buffer. In this circuit, the gate terminal of the transistor serves as the input, the source is the output, and the drain is common to both (input and output).

Design of electronic or radio frequency (RF) modules containing LNAs has become increasingly complicated in recent years. Designers are often faced with the challenge of meeting stringent requirements, particularly regarding space constraints. To overcome this challenge, designers may end up implementing multiple routes within the chip. However, this may come with the caveat of an increase in the output route capacitance, thus hurting the impedance matching performance of the circuit. When the output route is highly capacitive, the S22 parameter may undesirably be shifted, resulting in a reduction in gain, particularly in modules designed for operation at high frequencies.

One solution to mitigate the negative effects of high capacitance in the output route of an electronic or RF module is the use of a shunt inductor. However, this approach has the drawback of requiring additional module area and cost. This may not be feasible in many applications. Similarly, incorporating an on-chip inductor also incurs additional cost and increases the size of the integrated circuit (IC). Furthermore, the capacitance of the output routes may vary in different modules utilizing the same IC, thus adding another layer of complexity to the design.

In order to provide more details on the above-mentioned issues, reference is made to FIG. 1A showing a prior art LNA (100A) comprising: i) a first stage (102) including cascode transistors (T1, T2), ii) inductors (L1, Ls1), iii) inductive element (101) including inductors (Ld1, Ld2), and iv) capacitors (C1, C2, C3).

LNA (100A) is configured to receive an input signal at input terminal (IN) and to generate an amplified signal at output terminal (OUT), across load resistor (RL). The first stage (102) is followed by a second stage (103) arranged in a source-follower configuration. Second stage (103) includes transistor (T3) and inductor (Ls2). The source-follower configuration provides the benefit of a practically frequency-independent output matching for wideband applications.

LNA (100A) of FIG. 1A further comprises a switching network including switches (S1, S2, S3, S5, S6). The state of each switch can be selectively controlled based on the application. For example, LNA (100A) can be configured to operate in a low gain or high gain mode depending on the states of switches (S1, S2, S3). Signal paths (P1, P2) indicate the direction of the traveling signal when operating in low gain and high gain modes, respectively. Table (100B) of FIG. 1B shows the states of the switches (S1, S2, S3) for each of the gain modes. As an example, when operating in the low gain mode, switches (S1, S2, S3) are in (closed, open, open) states, respectively. As such, path (P1) is activated and traversed by the signal when in low gain mode. On the other hand, when operating in high gain mode, switches (S1, S2, S3) are in (open, closed, closed) state respectively, and path (P2) is activated. In this case, path (P1) is inactive. The lower gain mode requires lower current and provides improved linearity performance compared to the higher gain mode.

With further reference to FIG. 1A, switch (S5) is served to control the configuration of inductive element (101) to adapt to different applications. When switch (S5) is switched to the right-hand position, both inductors (Ld1, Ld2) are switched in. On the other hand, when switch (S5) is in the left-hand position, inductor (Ld1) is switched out. The series combination of (Ld1, Ld2) may be used for wider band applications. In the case of the narrow band applications and depending on the design requirements, inductor (Ld1) may be switched out. A combination of (Ld2 and/or Ld1) with capacitor (C3) performs the output matching functionality in the low gain mode. The input matching functionality is, on the other hand, performed by the combination of (Ls1, L1, C1). Switch (S6) is used to improve isolation. In other words, when the LNA is operating in the lower gain mode, switch (S6) may be selected to be closed to further isolate transistor (T3) from path (P1). During a higher gain mode operation, switch (S6) is in the open state as transistor (T3) is switched in to activate path (P2) for such gain mode.

With further reference to FIG. 1A, it can be appreciated that when LNA (100A) operates in the high gain mode, inductor (Ls2) is in the signal path and as a result, the issue of capacitive output route may be at least partially mitigated by the presence of such inductor. However, when in the low gain mode of operation, inductor (Ls2) is switched out and as a result, the negative impact of the output route capacitance on the circuit performance would be more pronounced.

In view of the above, there is a need for methods and devices to overcome the potential issues related to highly capacitive output routes of multiple gain LNAs, more in particular, when such LNAs operate in the low gain mode.

SUMMARY

The disclosed methods and devices address the above-mentioned issues, when operating either in high or the low gain mode, by making use of the already existing inductor, e.g. inductor (Ls2) of FIG. 1A, inside the LNA integrated circuit. By virtue of using the same inductor in both the high and low gain mode, there is no need to implement an additional shunt inductor and thus avoid additional cost and extra required space for the design.

According to a first aspect of the present disclosure, a low noise amplifier (LNA) is provided comprising: an input terminal and an output terminal; the output terminal being connectable to an output load; a first stage coupled to the input terminal; a second stage coupled between the first stage and the output terminal, the second stage including a transistor and a first inductive element; the first inductive element being coupled to a source terminal of the transistor at a first end and connected to a reference voltage at a second end; the second stage being included in a first signal path, the first signal path connecting an output of the first stage to the output terminal; a first capacitor disposed on a second signal path, the second signal path being different from the first signal path and connecting the output of the first stage to the output terminal; wherein: i) the LNA is configured to receive a signal at the input terminal; ii) in a first state: a) the first path is active, and the second path is inactive; and b) the LNA is configured to generate a first amplified signal across the output terminal and ground, and at the first end of the first inductive element; and iii) in a second state: a) the first path is inactive and the second path is active; and b) the LNA is configured to generate a second amplified signal at the output terminal and at the first end of the inductive element; the second amplified signal experiencing a lower gain level than the first amplified signal.

According to a second aspect of the present disclosure, a method of compensating a capacitance of output routes of a low noise amplifier (LNA) is disclosed, the LNA comprising: an input terminal and an output terminal; the output terminal being connectable to an output load; a first stage coupled to the input terminal; a second stage coupled between the first stage and the output terminal, the second stage including a transistor and an inductive element; the first inductive element being coupled to a source terminal of the transistor at a first end and connected to a reference voltage at a second end; and a capacitor; the method comprising: connecting an output of the first stage to the output terminal through the second stage to form a first signal path; connecting the output of the first stage to the output terminal through the capacitor to form a second signal path; receiving an input signal at the input terminal; in a first state: switching out the second signal path; and switching in the first signal path, thereby generating a first amplified signal at the output terminal and across the inductive element; and in a second state; switching out the first signal path; and switching in the second signal path, thereby generating a second amplifier signal at the output terminal and across the inductive element.

Further aspects of the disclosure are provided in the description, drawings and claims of the present application.

DESCRIPTION OF THE DRAWINGS

FIG. 1B shows a table summarizing the states of switches within the LNA of FIG. 1A.

FIG. 2B a table summarizing the states of switches within the LNA of FIG. 2A.

FIG. 3 shows a table summarizing the states of switches within an example LNA in accordance with an embodiment of the present disclosure.

FIG. 5B a table summarizing the states of switches within the LNA of FIG. 5A.

Figure 1A:
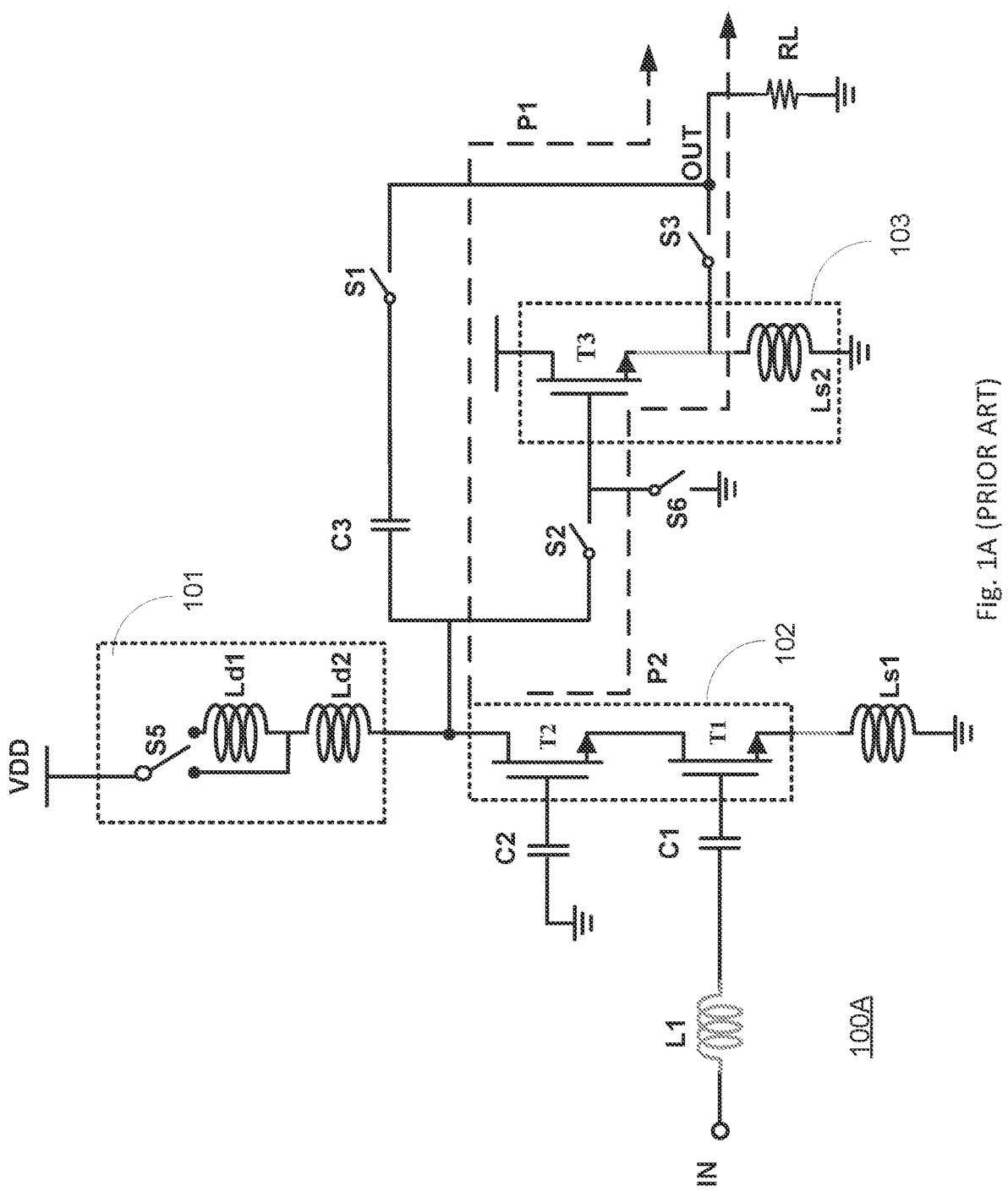
FIG. 1A shows a prior art LNA.

The "ground" symbol shown in the drawings indicates either a ground voltage or, more generally, a fixed reference voltage.

Like reference numbers and designations in the various drawings indicate like elements.

DETAILED DESCRIPTION

Figure 2A:
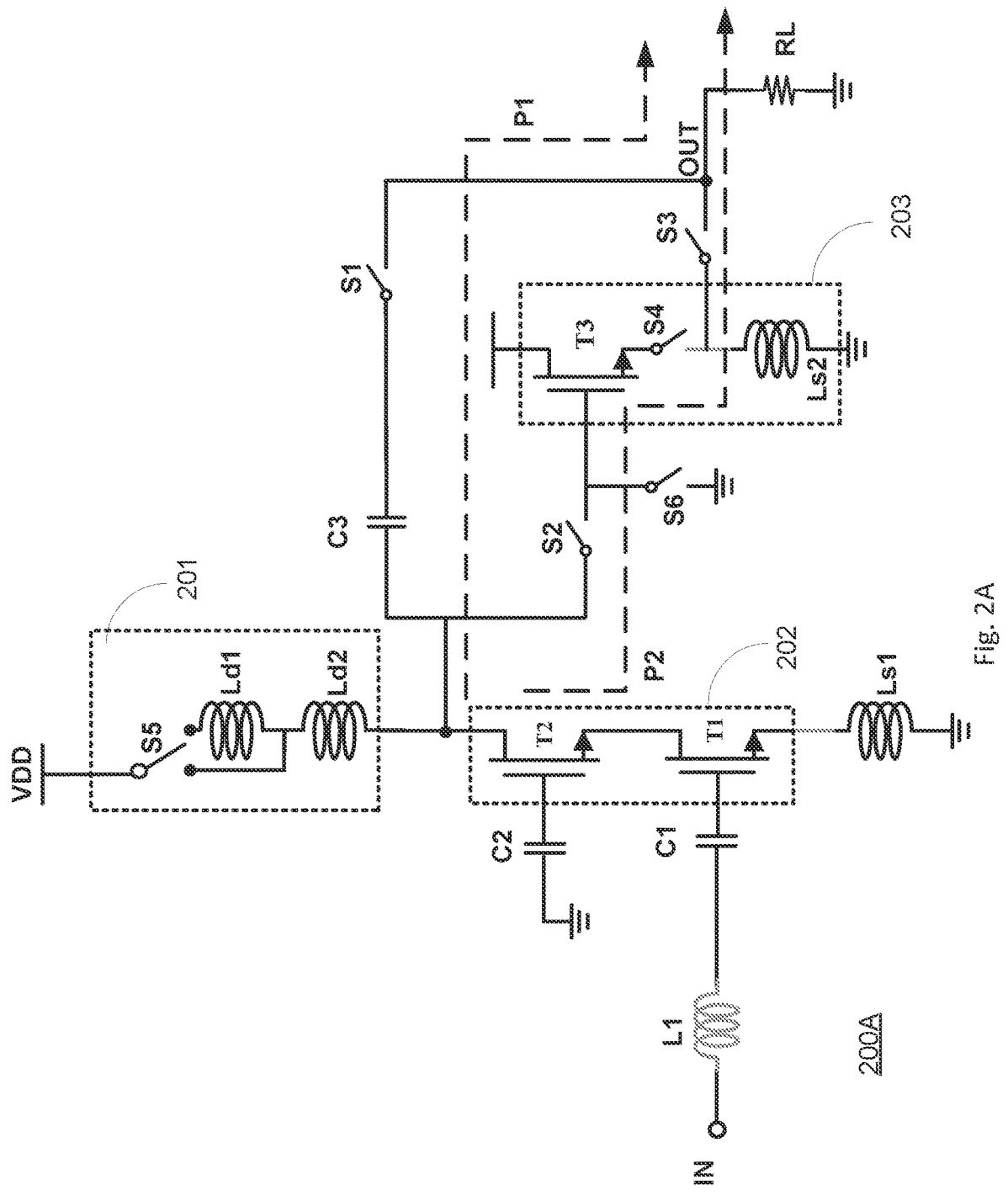
FIG. 2A shows an example LNA in accordance with an embodiment of the present disclosure.

FIG. 2A shows an example LNA (200A) in accordance with the embodiments of the present disclosure. The principle of operations of LNA (200A) is similar to what was described with regards to LNA (100A) of FIG. 1A, except for the presence of an additional switch (S4) and some differences in the states of switches in various gain modes.

FIG. 2B shows a table (200B) indicating the switching states for this LNA in accordance with the teachings of the present disclosure.

Referring back to FIG. 2A, switch (S4) is disposed in series with transistor (T3) within the source follower stage to provide more isolation when the LNA is operating in a low gain mode. In other words, while operating in a low gain mode, switch (S4) is open to further isolate transistor (T3) from path (P1), i.e. the signal path when operating in the lower gain mode. On the other hand, when operating in a high gain mode, as indicated by table (200B), switch (S4) is closed to switch in transistor (T3). As also indicated by table (200B), in contrast with what is shown in table (100B) of FIG. 1B, switch (S3) is now closed in both low gain and high gain modes. As a result, in both such modes, the circuit benefits from the presence of inductor (Ls2) in the signal path to counteract the previously described issues of the output route being possibly more capacitive than the design requirements would allow. Also, in the low gain mode, inductor (Ls2) will also take part in the output matching functionality in combination with (Ld1, Ld2, C3). As a result, the LNA will benefit from a wider band output matching capability. This LNA includes two transistors (T1, T2) in the first stage. However, the principles outlined throughout the present document can also be applied to embodiments having LNAs with one transistor in the first stage. In some embodiments, an LNA may comprise two or more transistors arranged as a cascode, or some other configuration.

FIG. 3 shows an example table (300) showing example switching states for an LNA with a structure similar to that of LNA (100A) of FIG. 1A (i.e. with no additional switch (S4) as in FIG. 2A), in accordance with an embodiment of the present disclosure. Table (300) differs from table (100B) in that switch (S3) in now closed in both the high and low gain modes. Similar to what was described in the case of LNA (200A) of FIG. 2A, this has the benefit of switching in inductor (Ls2) to overcome the signal output route capacitive issues. Moreover, the inclusion of an inductor (Ls2) in the low gain mode enables the LNA to operate with an improved output matching performance across a broader range of frequencies.

Figure 4:
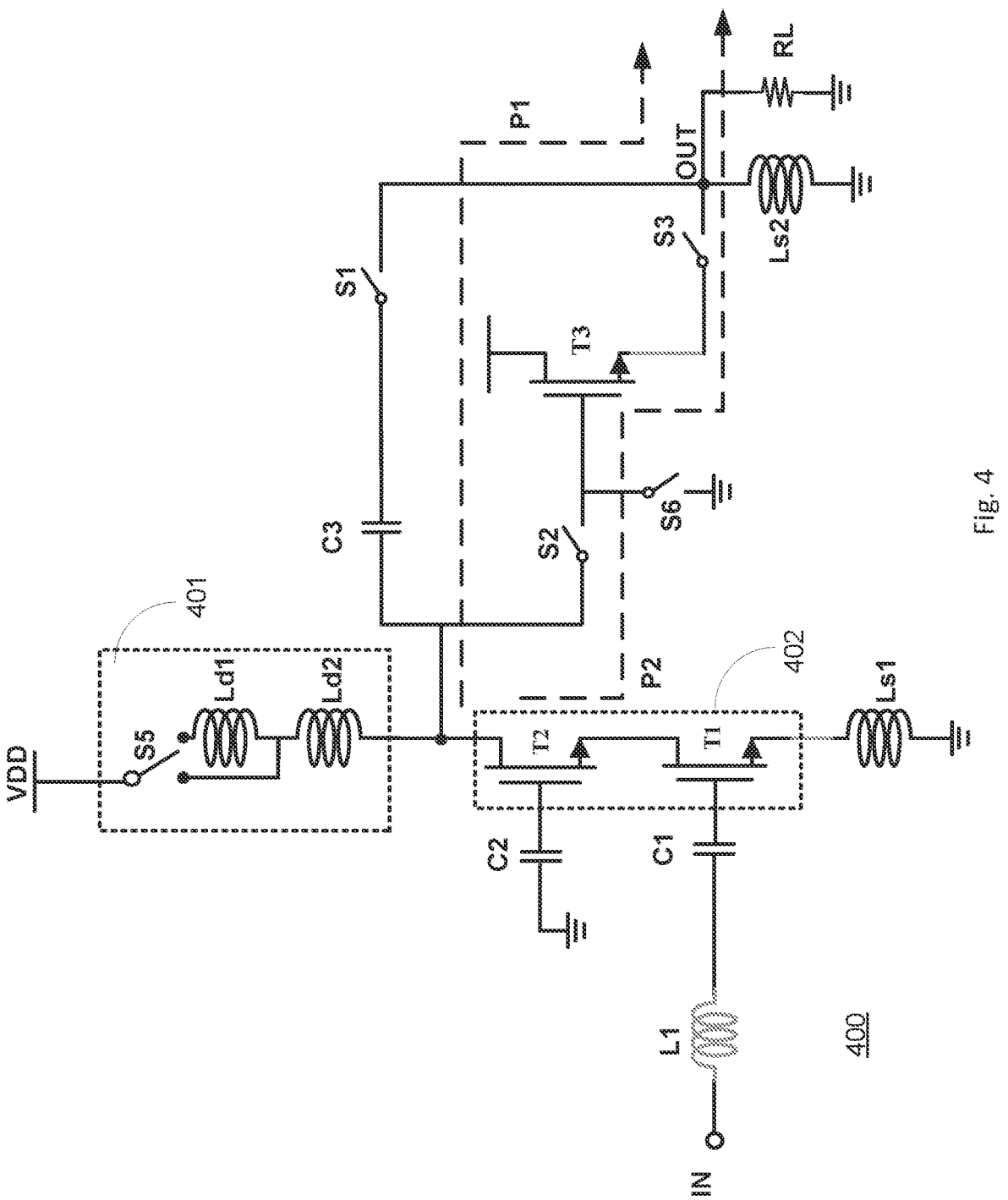
FIG. 4 shows an example LNA in accordance with an embodiment of the present disclosure.

FIG. 4 shows an additional example LNA (400) in accordance with the embodiments of the present disclosure. The principle of operation for LNA (400) is similar to the one described for LNA (100A) in FIG. 1A, except that inductor (Ls2) is now disposed downstream of switch (S3) and closer to output load (RL). This provides more isolation of the source follower stage, i.e. transistor (T3), when the LNA operates in the low gain mode. In some embodiments, this benefit may be obtained without including additional switching components in the circuit. According to the teachings of the present disclosure, the switching states of the switches in LNA (400) in the low and high gain modes is similar to what is indicated in table (100B) of FIG. 1B.

Figure 5A:
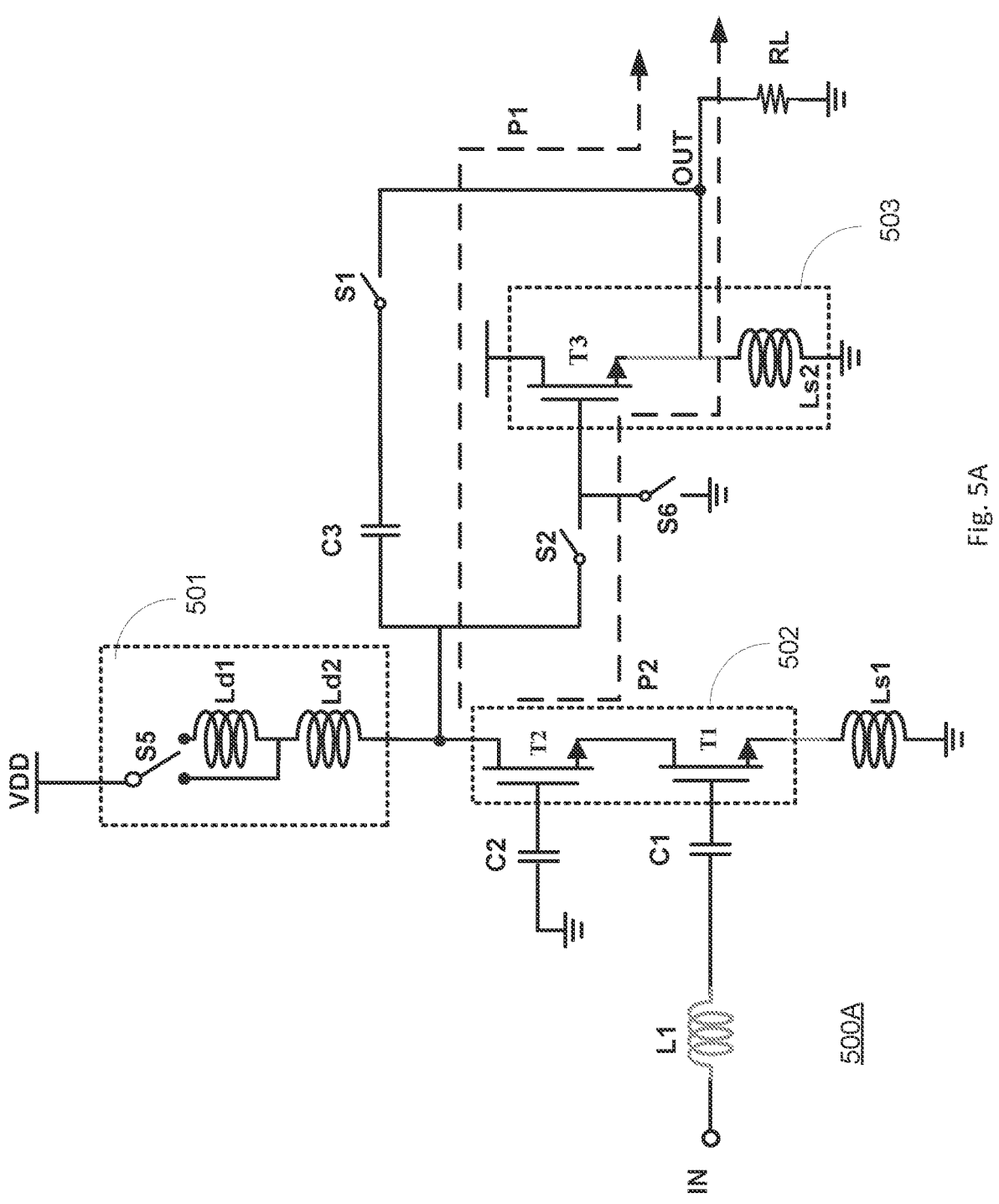
FIG. 5A shows an example LNA in accordance with an embodiment of the present disclosure.

FIG. 5A shows a further example LNA (500A) in accordance with the embodiments of the present disclosure. The principle of operation for LNA (500A) is similar to the one described for LNA (400) in FIG. 4, except that switch (S3) has now been removed. LNA (500A) may be used in applications with less stringent stability and isolation requirements where a higher gain level in the high gain mode is required. As switch (S3) has been removed, there is less insertion loss in the high gain path, while the isolation of transistor (T3) has been diminished when operating in the low gain mode. Table (500B) of FIG. 5B represents exemplary switching states in various gain modes for LNA (500A) of FIG. 5A in accordance with an embodiment of the present disclosure.

With reference to the disclosed embodiments, in some applications the size of inductor (Ls2) may be required to be different when operating in the low gain or high gain modes. This could be, as an example, a matter of tradeoff between the third order Input Intercept Point (IIP3) and the output return loss. Moreover, as mentioned previously, the integrated circuit containing the LNA may be disposed in different modules based on the application. As such, more design flexibility is highly desired as such modules may differ from one application to another.

Figure 6:
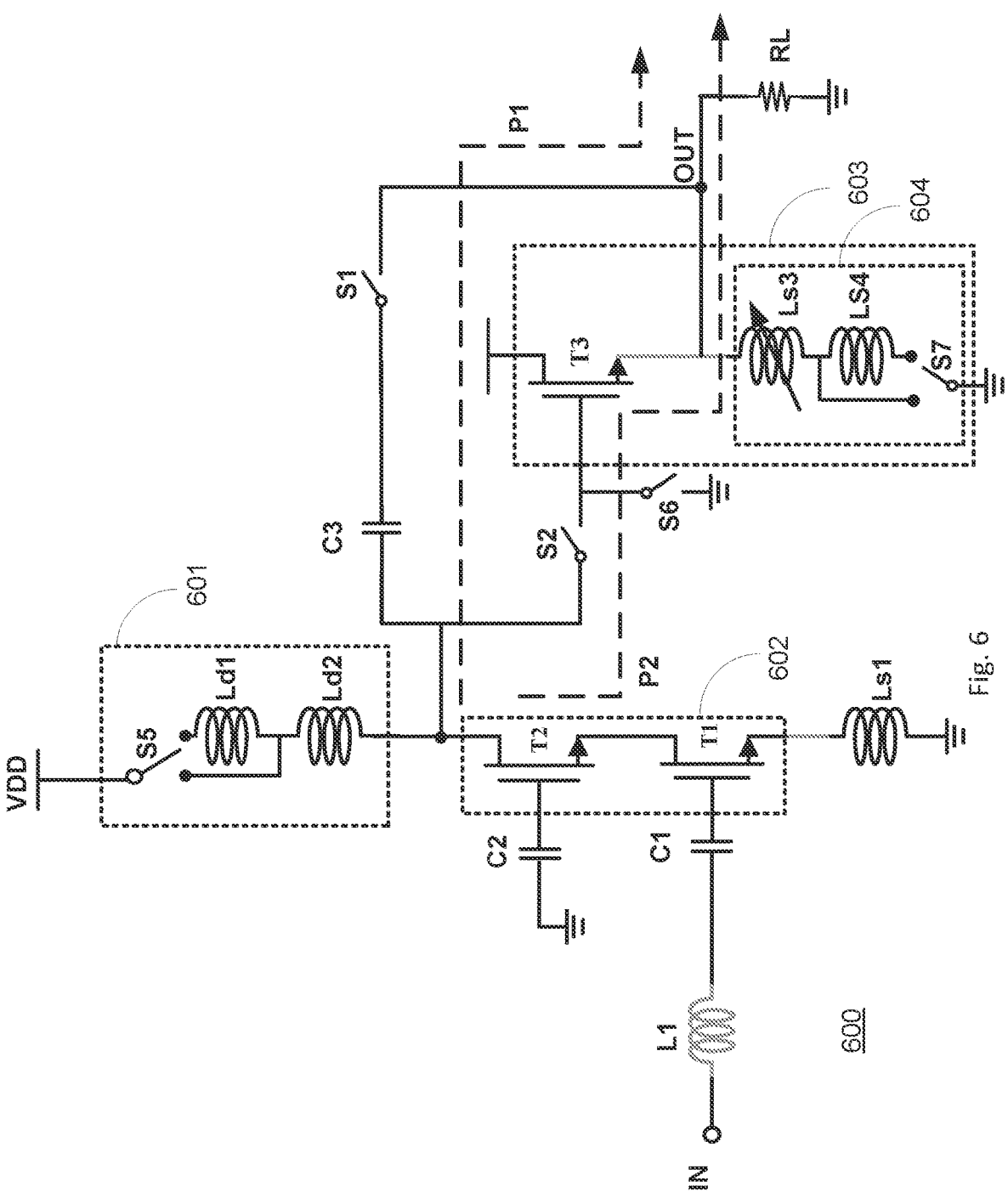
FIG. 6 shows an example LNA in accordance with an embodiment of the present disclosure.

FIG. 6 shows an example LNA (600) in accordance with yet another embodiment of the present disclosure. This LNA has similar structure and functionality as LNA (500A) of FIG. 5A except that inductor (Ls2) of FIG. 5A is now replaced by adjustable inductive element (604) which includes a series combination of inductor (Ls3), switchable inductor (Ls4), and switch (S7) used to control the configuration of the combination of inductors (Ls3, Ls4) by switching in and out inductor (Ls4). Inductor (Ls3) may be fixed or variable. When switch (S7) is positioned on the right-hand side, inductor (Ls4) is switched in. On the other hand, when switch (S7) is positioned on the left-hand side, inductor (Ls4) is switched out. The variable feature of adjustable inductor (604) provides an additional design flexibility to adapt to broader range of applications. In this embodiment, the states of switches corresponding to the low gain and high gain modes of operation are similar to the ones shown in table (500B) of FIG. 5B. In some embodiments, inductor (Ls4) is switched during time periods when a first bandwidth is desired and inductor (Ls4) is switched out during time periods when a second bandwidth is desired. In some embodiments, the first bandwidth is wider than the second bandwidth.

With continued reference to FIG. 6, the implementation of adjustable inductor (604) is illustrated by using the structure of LNA (500A) of FIG. 5A as an example. It is understood that inductor (Ls2) as shown in all the disclosed embodiments can be replaced by adjustable inductor (604) of FIG. 6 to provide design flexibility for each embodiment as described above.

According to the teachings of the present disclosure, all the switches shown in various disclosed embodiments may be implemented using field-effect transistors (FETs) and can be controlled using a control element implemented on or off chip. The teachings discussed throughout this document, using the structure of LNA (100A) in FIG. 1A as an example, can also be applied to LNAs with different structures. The disclosed LNAs can be incorporated into integrated circuits within a module that may be implemented as part of a communication system or device.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A low noise amplifier (LNA) comprising:
an input terminal and an output terminal; the output terminal being connectable to an output load;
a first stage coupled to the input terminal;
a second stage coupled between the first stage and the output terminal, the second stage including a transistor and a first inductive element; the first inductive element being coupled to a source terminal of the transistor at a first end and connected to a reference voltage at a second end; the second stage being included in a first signal path, the first signal path connecting an output of the first stage to the output terminal;
a first capacitor disposed on a second signal path, the second signal path being different from the first signal path and connecting the output of the first stage to the output terminal;
wherein:
i) the LNA is configured to receive a signal at the input terminal;
ii) in a first state:
a) the first path is active, and the second path is inactive; and
b) the LNA is configured to generate a first amplified signal across the output terminal and ground, and at the first end of the first inductive element; and
iii) in a second state:
a) the first path is inactive and the second path is active; and
b) the LNA is configured to generate a second amplified signal at the output terminal and at the first end of the inductive element; the second amplified signal experiencing a lower gain level than the first amplified signal.

2. The LNA of claim 1, further comprising a switching network, the switching network including:
a first switch disposed in the second signal path, the first switch connecting the first capacitor to the output terminal, and
a second switch disposed in the first signal path, the second switch connecting the output of the first stage to a gate terminal of the second stage transistor.

3. The LNA of claim 2, wherein:
in the first state: the first switch is open and the second switch is closed; and
in the second state: the first switch is closed and the second switch is open.

4. The LNA of claim 2, wherein the switching network further comprises:
a third switch disposed in the first signal path, downstream of the first inductive element, the third switch connecting the source terminal of the transistor to the output terminal.

5. The LNA of claim 4, wherein:
in the first state:
the first switch is open;
the second and the third switches are closed;
in the second state:

the first and the third switches are closed;
the second switch is open.

6. The LNA of claim 1, further comprising a switching network, the switching network including:
a first switch disposed in the second signal path, the first switch connecting first capacitor to the output terminal;
a second switch disposed in the first signal path, the second switch connecting the output of the first stage to a gate terminal of the transistor, and
a third switch disposed in the first signal path, upstream of the first inductive element, the third switch connecting the source terminal of the transistor to the output terminal.

7. The LNA of claim 6, wherein:
in the first state:
the first switch is open;
the second and the third switches are closed;
in the second state:
the first switch is closed;
the second and the third switches are open.

8. The LNA of claim 1, further comprising a switching network, the switching network including:
a first switch disposed in the second signal path, the first switch connecting the first capacitor to the output terminal;
a second switch disposed in the first signal path, the second switch connecting the output of the first stage to a gate terminal of the transistors;
a third switch disposed in the first signal path, downstream of the first inductive element, the third switch connecting the source terminal of the transistor to the output terminal, and
a fourth switch disposed in the first signal path, the fourth switch connecting the source terminal of the transistor to the first end of the first inductive element.

9. The LNA of claim 8, wherein:
in the first state:
the first switch is open;
the second, the third and the fourth switches are closed;
in the second state:
the first and the third switches are closed;
the second and the fourth switches are open.

10. The LNA of claim 2, where in the first inductive element comprises a first inductor arranged in series with a second inductor, and wherein the first inductor is a variable or a fixed inductor, and the second inductor is a selectively switchable inductor.

11. The LNA of claim 10, further comprising a second inductive element coupled to the output of the first stage, and wherein the second inductive element includes a third inductor arranged in series with a fourth inductor, the third inductor being switchable.

12. The LNA of claim 11, further comprising an input inductor arranged in series with an input capacitor; a combination of the input inductor and the input capacitor connecting the input terminal to the first stage.

13. The LNA of claim 3, further including a third switch disposed on the first signal path downstream from the second switch and coupling the gate terminal of the transistor to ground.

14. The LNA of claim 13, wherein the third switch is open in the first state and closed in the second state.

15. The LNA of claim 1, wherein the first stage comprises two or more transistors arranged in cascode configuration.

16. A method of compensating a capacitance of output routes of a low noise amplifier (LNA), the LNA comprising:

an input terminal and an output terminal; the output terminal being connectable to an output load;

a first stage coupled to the input terminal;

a second stage coupled between the first stage and the output terminal, the second stage including a transistor and an inductive element; the first inductive element being coupled to a source terminal of the transistor at a first end and connected to a reference voltage at a second end; and a capacitor;

the method comprising:

connecting an output of the first stage to the output terminal through the second stage to form a first signal path;

connecting the output of the first stage to the output terminal through the capacitor to form a second signal path;

receiving an input signal at the input terminal;

in a first state: switching out the second signal path; and switching in the first signal path, thereby generating a first amplified signal at the output terminal and across the inductive element; and in a second state; switching out the first signal path; and switching in the second signal path, thereby generating a second amplifier signal at the output terminal and across the inductive element.

17. The method of claim 16, wherein the first amplified signal experiences a higher gain than the second amplified signal.

18. The method of claim 16, wherein the source terminal of the transistor is connected to the inductive element in the first state and in the second state.

19. The method of claim 16, wherein the source terminal of the transistor:

is connected to the inductive element in the first state, and is disconnected from the inductive element in the second state.

20. The method of claim 16, wherein the inductive element comprises a variable or fixed inductor arranged in series with a switchable inductor.

* * * * *